United States Patent
Kubo et al.

(10) Patent No.: US 7,023,290 B2
(45) Date of Patent: Apr. 4, 2006

(54) TEMPERATURE-COMPENSATED CRYSTAL OSCILLATOR

(75) Inventors: Kuichi Kubo, Saitama (JP); Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/272,645

(22) Filed: Oct. 16, 2002

(65) Prior Publication Data
US 2003/0071696 A1    Apr. 17, 2003

(30) Foreign Application Priority Data
Oct. 17, 2001    (JP) .............................. 2001-319773

(51) Int. Cl.
*H03B 5/32*    (2006.01)
(52) U.S. Cl. .................. 331/158; 331/175; 331/108 C; 331/186; 331/74
(58) Field of Classification Search ................ 331/158, 331/176, 108 C, 186, 62, 74, 175
See application file for complete search history.

(56) References Cited

U.S. PATENT DOCUMENTS 4,048,584 A * 9/1977 Ulmer ......................... 331/62
6,147,564 A * 11/2000 Nakamiya et al. ............ 331/62

* cited by examiner

*Primary Examiner*—Arnold Kinkead
(74) *Attorney, Agent, or Firm*—Knobbe Martens Olson & Bear, LLP

(57) ABSTRACT

A temperature-compensated crystal oscillator is provided with an IC (integrated circuit) having a power supply terminal, an output terminal, and an automatic frequency control (AFC) voltage input terminal. In the temperature-compensated crystal oscillator, at least one oscillation circuit is integrated and the frequency-temperature characteristic of a quartz crystal unit is compensated. The temperature-compensated crystal oscillator includes one or more damping resistors for reducing the resonance acuteness of parasitic resonance circuits which result from inductance produced when mounting the IC on a wiring board and stray capacitance existing in the vicinity of each terminal of the IC. The dumping resistors are connected to at least one of the power supply terminal, output terminal, and automatic frequency control voltage input terminal.

11 Claims, 8 Drawing Sheets

TEMPERATURE-COMPENSATED CRYSTAL OSCILLATOR

BACKGROUND OF THE INVENTION

1. Field of the Invention

The present invention relates to a temperature-compensated crystal oscillator (TCXO) which is incorporated in devices such as portable telephones, and more particularly to a temperature-compensated crystal oscillator which reduces fluctuation in the oscillated frequency which is caused by an electromagnetic field produced at an antenna.

2. Description of the Related Art

Temperature-compensated crystal oscillators, in which variation in oscillation frequency that arises from the frequency-temperature characteristic of the quartz-crystal unit is compensated, find particularly wide use in devices such as portable telephones used in a mobile environment. In such devices, temperature-compensated crystal oscillators are used as, for example, the reference frequency sources of PLL (Phase Locked Loop) circuits which output the communication frequency signal. In such applications, the occurrence of phase error in the communication frequency or carrier frequency between base station and portable telephone causes breakdowns of communication, and the frequency stability of a temperature-compensated crystal oscillator is therefore crucial.

Referring to FIG. 1, in which is shown an example of the configuration of a temperature-compensated crystal oscillator of the prior art. This temperature-compensated crystal oscillator includes quartz-crystal unit 1 and IC (integrated circuit) 2, crystal unit 1 and IC 2 being accommodated within a container, as will be explained hereinbelow.

Crystal unit 1 uses, for example, an AT-cut quartz-crystal blank. Crystal unit 1 which employs an AT-cut crystal blank has a frequency-temperature characteristic which can be represented by a cubic function having an inflection point in the vicinity of normal temperature, as shown in FIG. 2.

IC 2, on the other hand, is a device in which are integrated voltage-controlled crystal oscillator 3, temperature compensation circuit 4, and AFC (automatic frequency control) input circuit 5 that receives as input an AFC voltage. Voltage-controlled crystal oscillator 3 includes crystal unit 1, oscillation circuit 7 which uses crystal unit 1, and voltage-variable capacitance element 6 which is inserted in an oscillation closed-loop. Crystal unit 1 is provided outside IC 2, i.e., independent of IC 2. Oscillation circuit 7 is provided with an oscillation capacitor (not shown in the figure) which forms a resonance circuit (i.e., the oscillation closed loop) together with crystal unit 1, and an oscillation amplifier (not shown in the figure) which feeds back and amplifies the resonant frequency component of the resonance circuit. As will be explained hereinbelow, a control voltage is applied to the cathode of voltage-variable capacitance element 6.

Temperature compensation circuit 4 is provided with temperature sensor 8 which detects the ambient temperature and outputs the temperature information as an electrical signal, and voltage generation circuit 9 which generates a temperature-compensation voltage based on the signal from temperature sensor 8. The temperature-compensation voltage is a voltage which varies as a cubic function with respect to the ambient temperature. The temperature-compensation voltage is applied to the cathode of voltage-variable capacitance element 6 by way of high-frequency blocking resistor 15. As a result, the equivalent serial capacitance of the oscillation closed-loop varies as seen from crystal unit 1 in accordance with the temperature-compensation voltage, the oscillation frequency of crystal oscillator 3 varies, the temperature dependence of the oscillation frequency of crystal oscillator 3 is compensated, and the oscillation frequency is kept uniform with respect to changes in the ambient temperature. The oscillation frequency of crystal oscillator 3 is dependent upon crystal unit 1 and therefore has a cubic function frequency-temperature characteristic similar to that of crystal unit 1 (see FIG. 2) if temperature compensation is not implemented.

This temperature-compensated crystal oscillator is loaded by, for example, surface mounting on the printed wiring board of a portable telephone, but various other communication circuits are loaded on this printed wiring board in addition to the temperature-compensated crystal oscillator. Of these communication circuits, the AFC circuit supplies the AFC voltage to AFC input circuit 5 of the temperature-compensated crystal oscillator. AFC input circuit 5 applies a voltage that accords with the supplied AFC voltage to voltage-variable capacitance element 6 by way of high-frequency blocking resistor 15 as with the case for the temperature-compensation voltage. Further, of the communication circuits, the AFC circuit receives radio waves from a relay base station, compares the frequency of these radio waves with the oscillation frequency of the temperature-compensated crystal oscillator, and controls the reference oscillation frequency (i.e., nominal frequency) of the temperature-compensated crystal oscillator, for example, the oscillation frequency at 25° C., such that it corresponds with the radio waves from the base station.

In IC 2, voltage-controlled crystal oscillator 3, temperature-compensation circuit 4, and AFC input circuit 5 are driven by a voltage that is obtained from a power supply voltage by way of constant voltage circuit 10 in IC 2. In addition, power supply terminal $V_{cc}$, output terminal $V_o$, AFC voltage input terminal $V_f$, and ground terminal GND are formed so as to be exposed on one principal-surface of IC 2.

IC 2 is normally provided with protection circuit 11 for preventing electrostatic breakdown of IC 2 due to the application of surge voltage, i.e., an instantaneous high voltage, to the various terminals other than the ground terminal. Protection circuit 11 is a circuit in which, for example, the midpoint of a pair of protection diodes 22a and 22b connected in series is connected to a corresponding terminal and which has its anode connected to the grounding point and its cathode connected to the power supply line, as shown in FIG. 3.

IC 2, in which each of these circuits is integrated as described in the foregoing explanation, and crystal unit 1 are accommodated in, for example, a container for surface mounting and constitute a practical temperature-compensated crystal oscillator. As shown in FIG. 4, a surface mounted container is made up from container body 12 composed of laminated ceramics and cover 13. A depression is formed in the upper surface of container body 12, and steps are formed in the side walls of the depression. Quartz crystal blank 1A that constitutes crystal unit 1 has one end secured to the end of this depression by means of, for example, a conductive adhesive and is thus held inside the depression. In addition, IC 2 is secured by, for example, ultrasonic thermal compression bonding to the bottom surface of the depression. Various mounting terminals 14 which are connected to the terminals of IC 2 such as the previously described power supply terminal $V_{cc}$, output terminal $V_o$, AFC terminal $V_f$ and ground terminal GND are formed on the outer surface of the container.

However, when the temperature-compensated crystal oscillator of the above-described configuration is mounted on a printed wiring board in a portable telephone and put into use, the phenomenon occurs that the frequency stability of the reference oscillation frequency deteriorates. Regarding this point, we investigated the portable telephone as the cause of the problem and found that, although no abnormality occurred during oscillation of the temperature-compensated crystal oscillator while the operation of the portable telephone was halted, the frequency stability deteriorated when the portable telephone was placed in operation and high-level radio waves were radiated from the antenna. Further, when the oscillation frequency of the temperature-compensated crystal oscillator changes, the output frequency (i.e., communication frequency) of a PLL circuit which is set as a multiple n (n being an integer) of this reference signal source also changes, imitating the frequency fluctuation of the reference signal source. Although the AFC circuit in the portable telephone changes the AFC voltage $V_f$ in the direction of oscillation frequency with the reference frequency of the base station to thereby correct the output frequency of the temperature-compensated crystal oscillator when such variation occurs, transitory phase change, i.e., phase error, still occurs. The occurrence of phase error has the unwanted effect of preventing communication, and the occurrence of phase error must therefore be suppressed.

SUMMARY OF THE INVENTION

It is an object of the present invention to provide a temperature-compensated crystal oscillator that effectively maintains frequency stability and that thereby suppresses the occurrence of phase error.

The object of the present invention is achieved by arranging, in an IC in a temperature-compensated crystal oscillator according to the foregoing explanation, a damping resistor connected to at least one of the power supply terminal, the output terminal and the automatic frequency control voltage input terminal for reducing a Q factor of a parasitic resonance circuit which includes the corresponding terminal. This damping resistor is preferably inserted between a protection diode for preventing electrostatic breakdown which is provided connected to each respective terminal of the IC and the corresponding terminal.

Explanation next regards the results of an investigation conducted by us for achieving the object of the present invention. We have searched for the causes of deterioration in frequency stability as described hereinabove, and as a result of continued research, have come to the following conclusions, whereby the present invention was completed.

When a temperature-compensated crystal oscillator is mounted by securing with solder to a printed wiring board, wiring paths on the wiring board as shown in FIG. 5 cause an inductor component (inductance) L at each mounting terminal 14. A resonance circuit is formed by this inductance L and the stray capacitance that exists in the vicinity of each terminal of IC 2, particularly the parasitic capacitance C22 of protection diodes 22a and 22b. This resonance circuit becomes a parasitic resonance circuit with respect to the terminal and is referred to as a "terminal resonance circuit". Inductance L and parasitic capacitance C22 are both small, and the resonant frequency produced by the terminal resonance circuit is high. In FIG. 5, Z represents input impedance of the next stage.

The communication frequency of a portable telephone that is outputted from the PLL circuit that takes a temperature-compensated crystal oscillator as the reference signal source is, for example, a high frequency in 900 MHz band or 1.9 GHz band. The electromagnetic field that is thus excited by the portable telephone antenna for radiating radio waves causes resonance with the terminal resonance circuit and thus induces a high-frequency current $i_0$ which penetrates into IC 2 from each terminal. The letters A and B in the figure indicate the directions of the electromagnetic field. According to our views, the high-frequency current $i_0$ which resonates with the terminal resonance circuits influences components in IC 2 such as power supply circuit including constant-voltage circuit 10, oscillation circuit 7 including an oscillation amplifier, temperature-compensation circuit 4 and AFC input circuit 5, and therefore causes deterioration of frequency stability. In particular, the high-frequency current $i_0$ is rectified by nonlinear elements such as diodes and transistors in IC 2 and generates a dc component. This dc component is then applied to, for example, voltage-variable capacitance element 6, and this input is believed to cause the reference oscillation frequency to change.

Based on this study, we believe that decreasing the acuteness of resonance (i.e., Q factor) of the terminal resonance circuit can prevent penetration into IC 2 by the high-frequency current that is caused by the electromagnetic field, can relatively reduce the resonance level, and can mitigate the influence upon each circuit in IC 2 and thus effectively maintain the frequency stability. We have therefore arrived at the present invention in which damping resistors are provided at each terminal in IC 2 to reduce the Q factor of the parasitic resonance circuits.

As described in the foregoing explanation, according to the present invention, connecting a damping resistor to at least one terminal of the power supply terminal, output terminal, and AFC input terminal of an IC reduces the acuteness of resonance of the parasitic resonance circuits of the terminal and prevents a high-frequency current that is caused by the electromagnetic field from the antenna of a portable telephone from penetrating into the IC. As a result, the present invention can provide a temperature-compensated crystal oscillator that effectively maintains frequency stability.

DETAILED DESCRIPTION OF THE INVENTION

Figure 1:
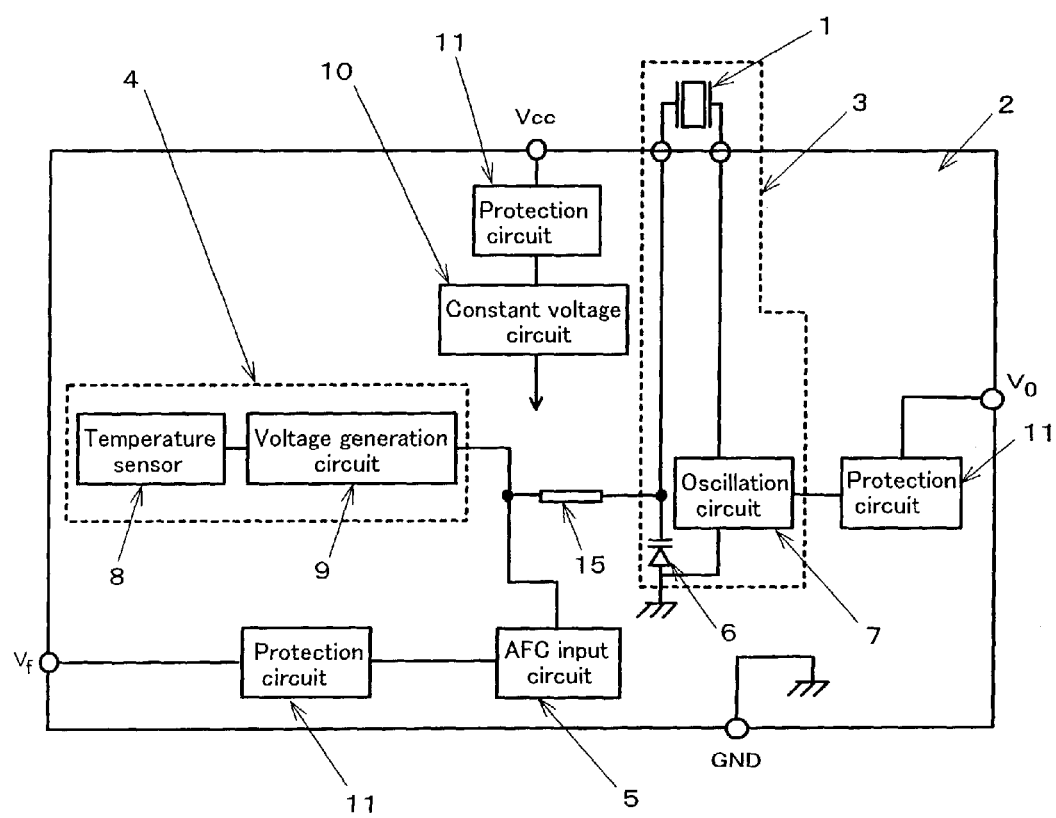
FIG. 1 is a schematic block diagram showing a temperature-compensated crystal oscillator of the prior art.
Figure 2:
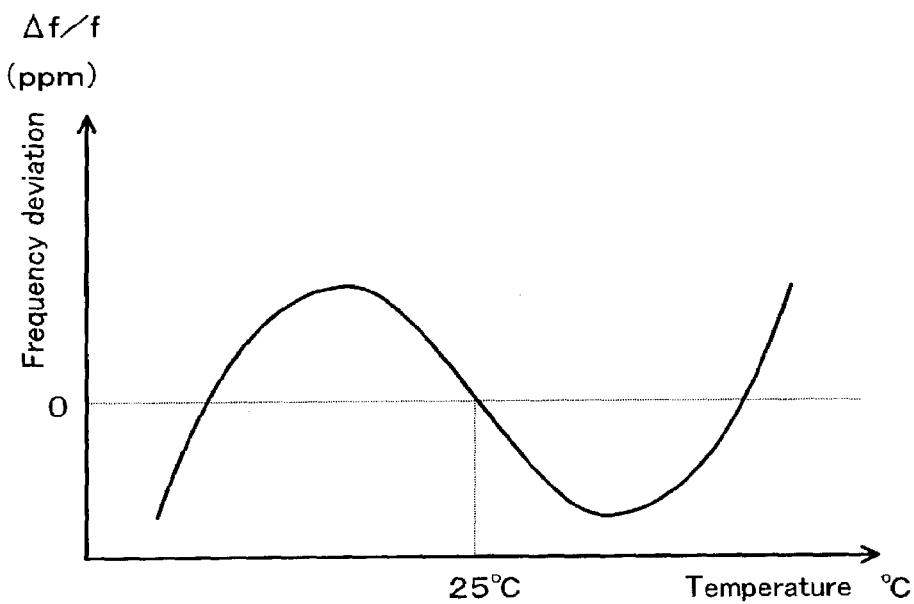
FIG. 2 is a graph showing the frequency-temperature characteristic of a quartz crystal unit used in a crystal oscillator.
Figure 4:
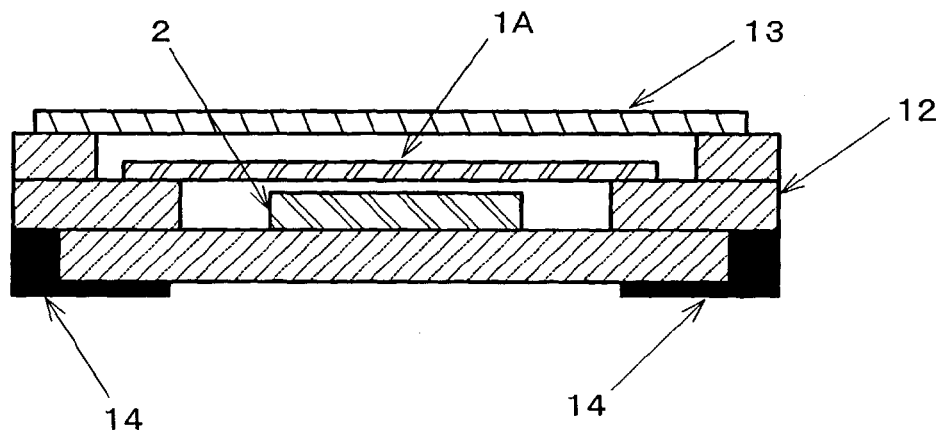
FIG. 4 is a sectional view showing the construction of a temperature-compensated crystal oscillator which is accommodated in a container for surface mounting.
Figure 5:
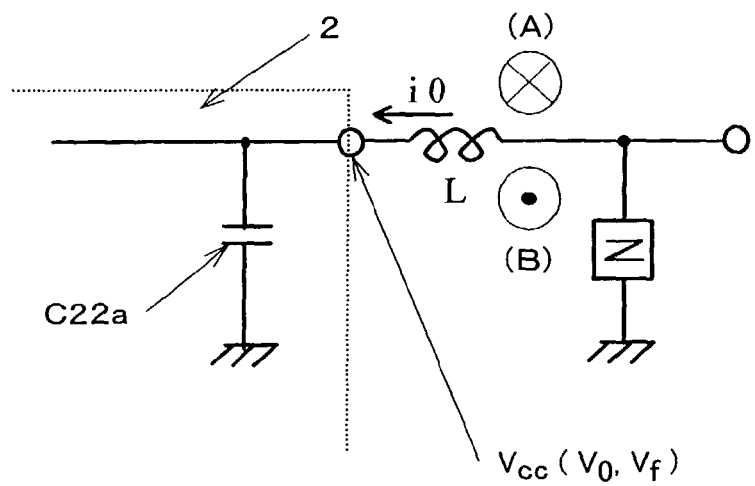
FIG. 5 is a partial equivalent circuit diagram for explaining the causes of frequency fluctuation in a temperature-compensated crystal oscillator of the prior art.
Figure 6:
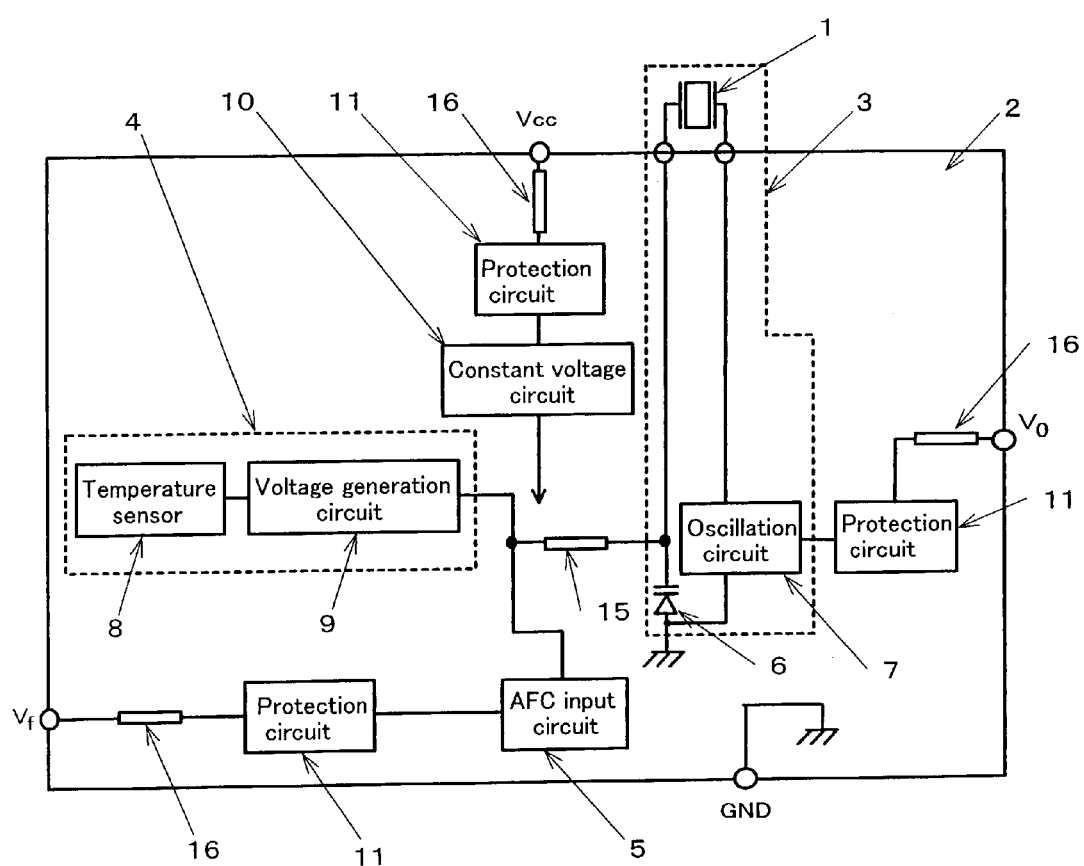
FIG. 6 is a schematic block diagram showing a temperature-compensated crystal oscillator according to an embodiment of the present invention.

Referring now to FIG. 6, the temperature-compensated crystal oscillator of the first embodiment of the present invention is similar to the temperature-compensated crystal oscillator of the prior art which is shown in FIG. 1. The temperature-compensated crystal oscillator of the present embodiment includes, as previously described, quartz crystal unit 1 having a frequency-temperature characteristic that is a cubic function, and IC 2. These components are accommodated in a container for surface mounting having mounting terminals 14 as shown in FIG. 4. In FIG. 6, constituent elements that are identical to elements in FIG. 1 are identified by the same reference numerals. Components such as voltage-variable capacitance element 6, oscillation circuit 7, temperature compensation circuit 4, AFC input circuit 5, constant-voltage circuit 10, and protection circuits 11 for preventing electrostatic damage are integrated on IC 2.

Figure 3:
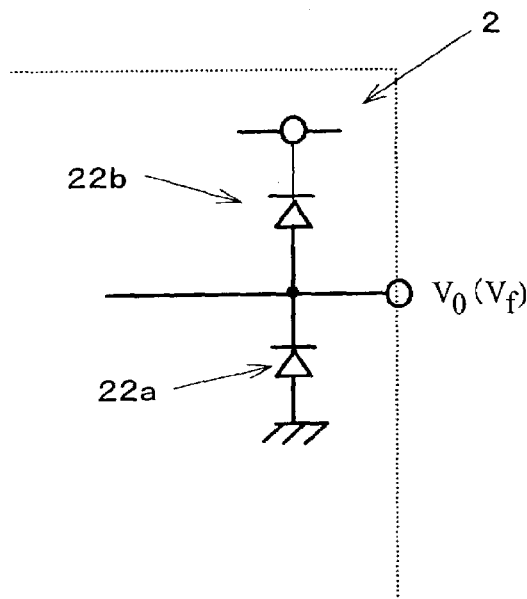
FIG. 3 is a circuit diagram showing an example of a protection circuit used in a temperature-compensated crystal oscillator of the prior art.

The temperature-compensated crystal oscillator shown in FIG. 6 differs from the temperature-compensated crystal oscillator of the prior art which is shown in FIG. 1 in that damping resistors 16 are inserted between power supply terminal $V_{cc}$ and corresponding protection circuit 11, between output terminal $V_o$ and corresponding protection circuit 11, and between AFC input terminal $V_f$ and corresponding protection circuit 11 of IC 2. These damping resistors 16 are provided for reducing the resonance acuteness of the terminal resonance circuits which are parasitic to the terminals. Components that are identical to the components shown in FIG. 3 are used as protection circuits 11.

Figure 7A:
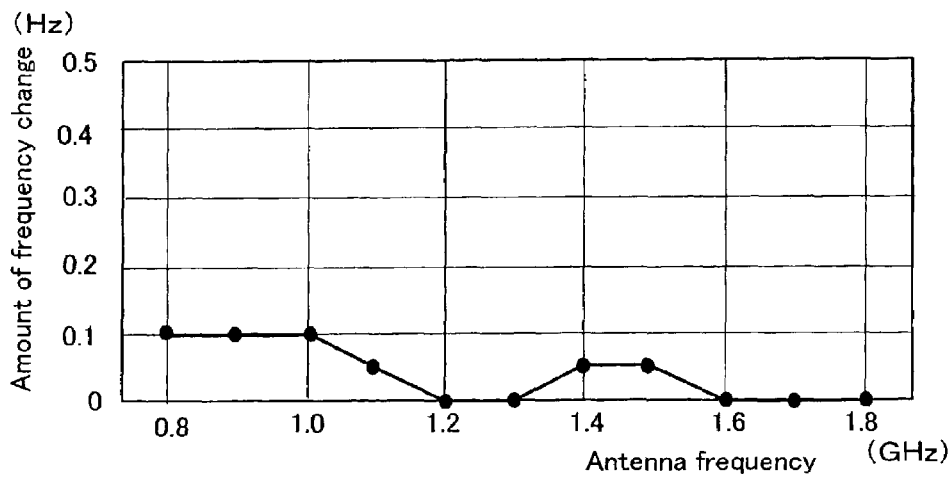
FIGS. 7A and 7B are graphs showing the amount of change of the oscillation frequency with respect to antenna frequency.
Figure 7B:
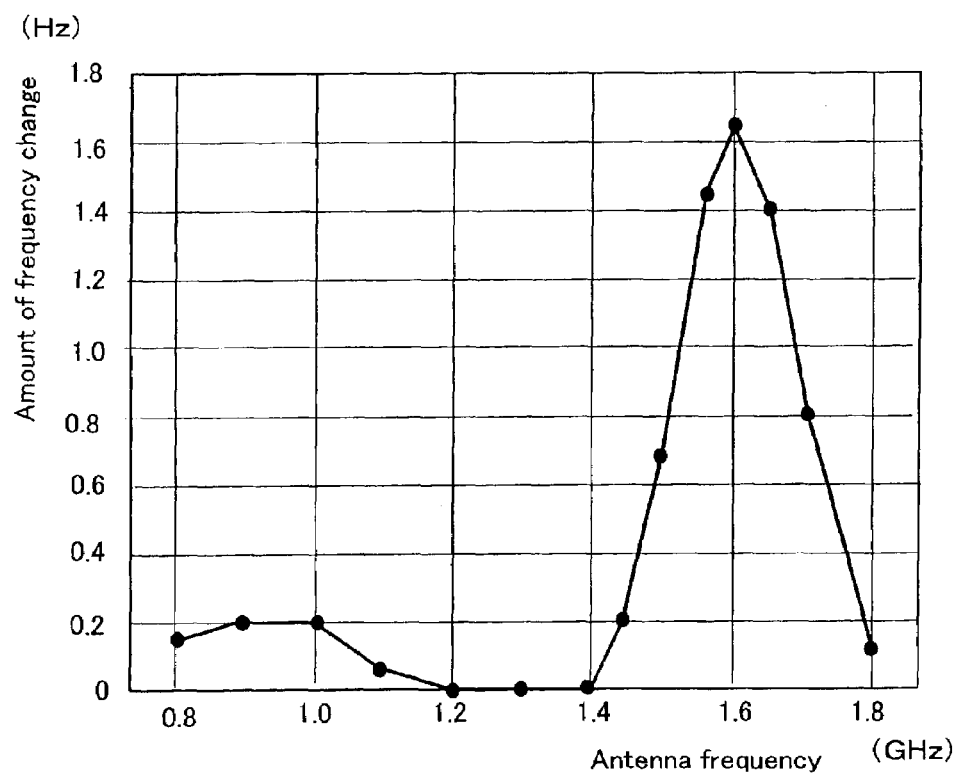

Explanation next regards the improvement in the frequency stability of the temperature-compensated crystal oscillator that is realized by this provision of damping resistors 16. Here, the characteristics of frequency change were investigated for each of the temperature-compensated crystal oscillator of the configuration shown in FIG. 6 and the temperature-compensated crystal oscillator of the prior art shown in FIG. 1 when these temperature-compensated crystal oscillators were arranged in the same situation in which a high-frequency electromagnetic field was being generated. FIG. 7A is a characteristics chart of the frequency change of a temperature-compensated crystal oscillator of the present embodiment shown in FIG. 6, while FIG. 7B shows the characteristics of frequency change of the temperature-compensated crystal oscillator of the prior art shown in FIG. 1. In these graphs, the horizontal axis shows in GHz the frequency of a high-frequency signal that is supplied from signal generator SG to an antenna, i.e., the frequency of the electromagnetic field; and the vertical axis shows in Hz the amount of frequency change when temperature-compensated oscillator is caused to oscillate at the reference oscillation frequency (13 MHz).

Figure 8:
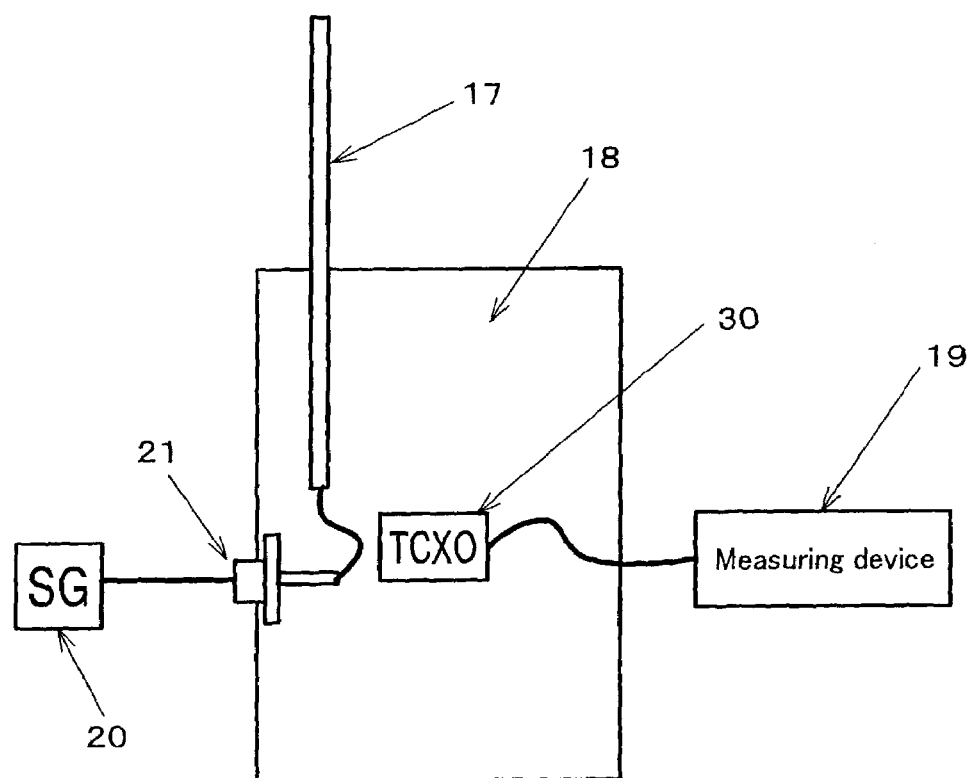
FIG. 8 shows the arrangement for measuring the amount of change in frequency caused by the presence of a high-frequency electromagnetic field.

Furthermore, as shown in FIG. 8, temperature-compensated crystal oscillator (TCXO) 30 is connected and mounted by solder to dummy wiring board 18 having antenna 17. Dummy wiring board 18 simulates the portable telephone. Measuring device 19 such as a frequency counter is connected to temperature-compensated crystal oscillator 30. High-frequency power is supplied to antenna 17 from signal generator (SG) 20, and the frequency of the oscillation output of temperature-compensated crystal oscillator 30 is measured. Connector 21 connects signal generator 20 to antenna 17.

As shown in FIG. 7A, when damping resistors 16 are provided at the terminals of IC 2, change in the oscillation frequency of the temperature-compensated crystal oscillator was 0.1 Hz or less when the frequency of the high-frequency power which is supplied to antenna 17 is within the range of 0.8 to 1.8 GHz. In contrast, as shown in FIG. 7B, when damping resistors are not provided at the terminals of IC 2, a characteristic was seen in which the amount of change in frequency increased sharply when the frequency of the high-frequency power supplied to the antenna was greater than 1.4 GHz, reached a maximum of 1.65 Hz when the supplied frequency was 1.6 GHZ, and then dropped sharply as the supplied frequency increased to 1.8 GHz.

As is obvious from the results of this comparative experiment, the frequency change characteristic in the temperature-compensated crystal oscillator of the prior art is a shape having a maximum at 1.6 GHz in the range from 1.4 up to 1.8 GHz, and these results indicate the existence of some type of resonance phenomenon. In other words, as previously explained, it is inferred that the stray capacitance in the vicinity of each of the terminals (e.g., power supply terminal $V_{cc}$, output terminal $V_o$, and AFC input terminal $V_f$) of IC 2 and the inductance component produced by mounting the temperature-compensated crystal oscillator form a terminal resonance circuit. It is considered that when the antenna frequency approaches the resonance frequency that is produced by the terminal resonance circuits, the electromagnetic field that is produced by the high-frequency power supplied to the antenna invades the interior of IC 2 from each of the terminals of IC 2 by way of the terminal resonance circuits and is rectified by nonlinear elements in IC 2, following which the resulting dc component is added to, for example, the temperature-compensated voltage. It is considered that, compared to the temperature-compensated voltage that is applied to the voltage-variable capacitance element during the oscillation at the reference oscillation frequency, an excessive voltage is applied to the voltage variable capacitance element, thereby bringing about frequency change.

In the experiment shown here, the resonant frequency of the terminal resonance circuits is 1.8 GHz, and this differs from 900 MHz or 1.9 GHz, which are the actual communication frequencies in a portable telephone. Although it is considered that the influence exercised by the high-frequency power which is supplied to the antenna upon the oscillation frequency is reduced when the communication frequency diverges from the resonance frequency of the terminal resonance circuits, it is considered that a large amount of frequency change is produced in the configuration of the prior art when the resonant frequency matches or approaches the antenna frequency because the resonant frequency of the terminal resonance circuits changes randomly according to the state of mounting or the wiring pattern and wiring length on the printed wiring board.

Figure 9:
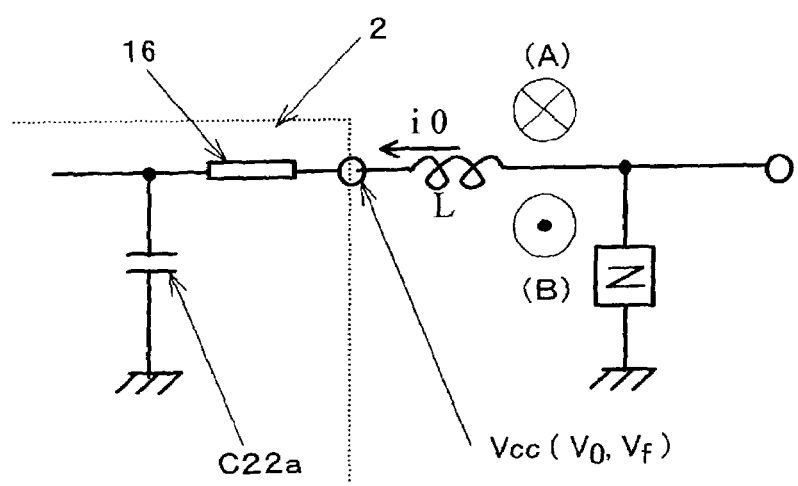
FIG. 9 is a partial equivalent circuit diagram for explaining the operation of the temperature-compensated crystal oscillator shown in FIG. 6.

In the temperature-compensated crystal oscillator of the present embodiment, damping resistors 16 are connected between each of the terminals (power supply terminal $V_{cc}$, output terminal $V_o$, and AFC input terminal $V_f$) of IC 2 and protection circuits 11 made up by protection diodes, whereby damping resistors 16 are equivalently inserted between the parasitic capacitance C22 of protection diodes 22 and inductance L due to the mounting as shown in FIG. 9. The resonance acuteness (Q factor) of the terminal resonance circuits that are made up by parasitic capacitance C22 and inductance L is reduced, with the result that the state of resonance is eliminated or weakened. The level of the high-frequency current $i_0$ that arises in terminal resonance circuits due to the electromagnetic field which is produced at the antenna is the same level as the frequency during times other than resonance frequency, and the high-frequency current during resonance frequency is therefore suppressed and the high-frequency current that penetrates from each of the terminals of IC 2 is reduced. The generation of a dc component due to the rectification in nonlinear elements such as diodes and transistors in the IC is therefore prevented. This has the effect of, for example, reducing the influence upon constant-voltage circuit 10 and preventing influence upon the temperature-compensation voltage that is applied to voltage-variable capacitance element 6. Thus, the reference oscillation frequency can be stably maintained in the temperature-compensated crystal oscillator of the present embodiment.

Figure 10A:
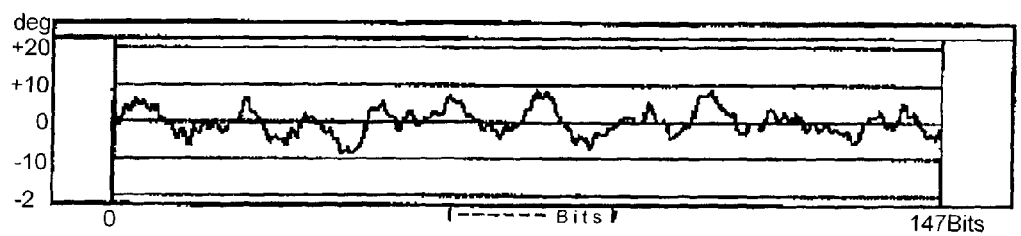
FIGS. 10A and 10B are graphs showing the phase error in the communication frequency component which is outputted from a PLL circuit when using the temperature-compensated crystal oscillator shown in FIG. 6 and when using the temperature-compensated crystal oscillator of the prior art, respectively.
Figure 10B:
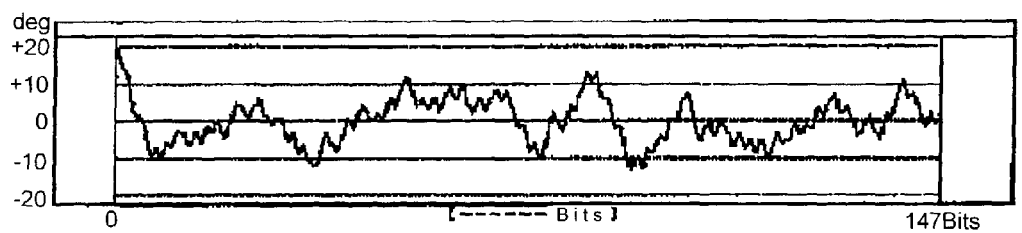

These factors result in excellent frequency stability and phase characteristics in the communication frequency, which is the output from the PLL circuit that takes the oscillation frequency from the temperature-compensated crystal oscillator of the present embodiment as the reference signal source, and phase error with the base station is therefore prevented. Here, FIG. 10A shows the phase error characteristic of a communication frequency from a PLL circuit when the output of the temperature-compensated crystal oscillator of the present embodiment shown in FIG. 6 is taken as the reference signal and supplied to the PLL circuit; and FIG. 10B shows the phase error characteristic of the communication frequency from a PLL circuit when the output of the temperature-compensated crystal oscillator of the prior art shown in FIG. 1 is taken as the reference signal and supplied to the PLL circuit. In these graphs, the horizontal axis represents the bits that are obtained by dividing time, and the vertical axis is the phase error, that is, the degree and amount of phase shift. Further, the amount of phase error is the amount of phase shift in the PLL circuit with respect to the communication frequency of the base station, i.e., reference frequency. As can be understood from these graphs, the use of the temperature-compensated crystal oscillator according to the present embodiment results in an amount of phase error of 3.6° at the RMS (root mean square) value and 9.0° at the peak value, as shown in FIG. 10A, and these values easily satisfy the standards set for this type of portable telephone, i.e., that phase error fall within 5° at the RMS value and within 20° at the peak value. In contrast, the use of a temperature-compensated crystal oscillator of the prior art results in phase error of 6.0° at the RMS value and 21° at the peak value as shown in FIG. 10B, and both of these values fail to satisfy the set standards.

Figure 11A:
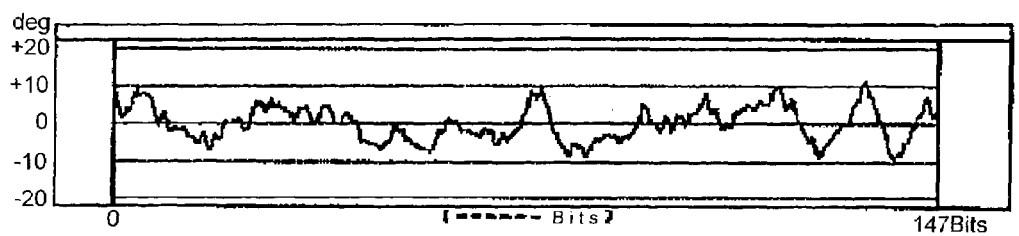
FIGS. 11A, 11B, and 11C are graphs showing the phase error in the communication frequency component that is outputted from a PLL circuit when using a temperature-compensated crystal oscillator in which a damping resistor is provided in only the power supply terminal, only the output terminal, and only the AFC input terminal, respectively.
Figure 11B:
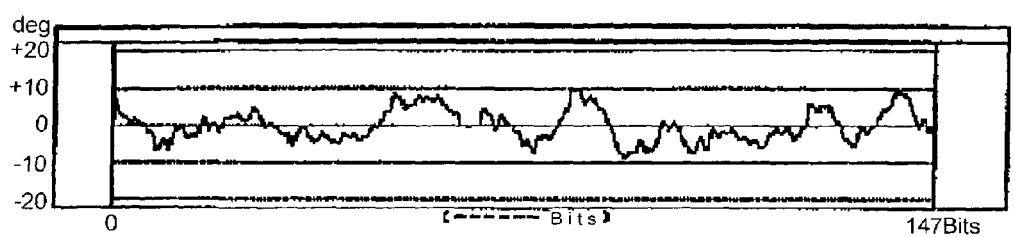
Figure 11C:
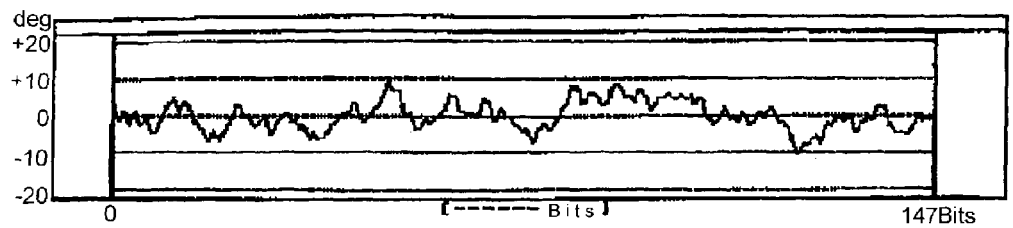

Although damping resistors 16 were provided at all terminals other than the ground terminal GND of IC 2, i.e., power supply terminal $V_{cc}$, output terminal $V_o$, and AFC input terminal $V_f$ in the temperature-compensated crystal oscillator according to the above-described preferable embodiment of the present invention, the present invention is not limited to this form. The effects of the present invention are exhibited even when damping resistor 16 is connected at only one of these terminals. FIG. 11A shows the phase error characteristic for a case in which damping resistor 16 is connected only to power supply terminal $V_{cc}$, FIG. 11B shows the phase error characteristic for a case in which damping resistor 16 is connected only to output terminal $V_o$, and FIG. 11C shows the phase error characteristic for a case in which damping resistor 16 is connected only to AFC input terminal $V_f$. In the cases shown in any of FIGS. 11A to 11C, the phase error characteristic is somewhat degraded compared to a case in which damping resistors 16 are connected to all terminals other than the ground terminal. We believe this result is obtained because the connection of damping resistors 16 to all terminals other than the ground terminal reduces both the total high-frequency current that penetrates into IC 2 and the dc component that is produced by the rectification of this high-frequency current.

When damping resistor 16 was connected to only one terminal as shown in FIGS. 11A to 11C, the above-described standards were not satisfied in several cases. The phase error characteristic differs according to the terminal at which the damping resistor is provided, and this effect is believed to result from the variation in the state of the electromagnetic fields according to the positions of the antenna and printed wiring board and the consequent changes in the amount of high-frequency current that penetrates each terminal. Nevertheless, connecting a damping resistor to any one terminal results in an improvement in the phase error characteristic over the above-described temperature-compensated crystal oscillator of the prior art. It is therefore considered that even when a damping resistor is connected to only one of the terminals, the above-described standards can be easily satisfied by appropriately setting the shape of the wiring pattern on a printed wiring board and the position of the antenna.

Although only the parasitic capacitance of protection diodes was shown as the capacitance component that constitutes the terminal resonance circuit in the foregoing explanation, it should be obvious that other stray capacitance may be included in the capacitance component of the terminal resonance circuits. Further, although damping resistors 16 were formed inside IC 2 in the above-described embodiment, a similar effect can be obtained by connecting damping resistors outside the IC as long as the damping resistors are within the range of resonance circuits that are parasitic to the terminals of IC 2.

What is claimed is:

1. A temperature-compensated crystal oscillator of a surface mount type comprising:

an integrated circuit which has at least a power supply terminal, an output terminal, and an automatic frequency control voltage input termial; and a crystal blank as a crystal unit, wherein said integrated circuit and said crystal blank are accommodated into a container and hermetically sealed in the container, said container provided with respective mounting terminals corresponding to said power supply terminal, said output terminal, and said automatic frequency control voltage input terminal, said integrated circuit comprising:

an oscillation circuit which is integrated in the integrated circuit and connected to said crystal unit to form an oscillation closed loop; and a damping resistor which is provided outside the oscillation closed loop and connected to at least one terminal of said power supply terminal, said output terminal, or said automatic frequency control voltage input terminal for reducing resonance acuteness of a parasitic resonance circuit which is produced by inductance which occurs when mounting said temperature-compensated crystal oscillator on a wiring board via the mounting terminals and stray capacitance which exists in a vicinity of said at least one terminal, wherein said temperature-compensated crystal oscillator compensates a frequency-temperature characteristic of the crystal unit to output a frequency signal, wherein said integrated circuit is further provided with a protection circuit for preventing electrostatic breakdown having a parasitic capacitance; and wherein said damping resistor is inserted between said at least one terminal and said protection circuit, said damping resistor being independent of said protection circuit.

2. The temperature-compensated crystal oscillator according to claim 1, wherein said protection circuit comprises a protection diode.

3. A temperature-compensated crystal oscillator of a surface mount type being configured to be mounted on a wiring board and comprising:

an integrated circuit which includes a power supply terminal, an output terminal, and an automatic frequency control voltage input terminal;

a crystal blank which is a crystal unit; and a container in which the integrated circuit and the crystal blank are accommodated and hermetically sealed said container being provided with mounting terminals corresponding to the power supply terminal, the output terminal, and the automatic frequency control voltage input terminal, respectively, said integrated circuit comprising:

an oscillation circuit which is integrated in the integrated circuit and connected to the crystal unit to form an oscillation closed loop;

protection circuits connected to the power supply terminal, the output terminal, and the automatic frequency control voltage input terminal, respectively, to prevent electrostatic breakdown having a parasitic capacitance; and at least one of (a), (b), or (c) being provided outside the oscillation closed loop for suppressing phase errors which occur when mounting said integrated circuit on the wiring board via the mounting terminals of the container: (a) a damping resistor between said power supply terminal and the corresponding protection circuit, (b) a dam in resistor between said output terminal and the corresponding protection circuit, or (c) a damping resistor between said automatic frequency control voltage input terminal and the corresponding protection circuit.

4. The temperature-compensated crystal oscillator according to claim 3, wherein each of said protection circuits comprises a protection diode.

5. The temperature-compensated crystal oscillator according to claim 1, wherein said integrated circuit further comprises a voltage-variable capacitance element inserted in an oscillation closed loop.

6. The temperature-compensated crystal oscillator according to claim 5, wherein:

said integrated circuit comprises a temperature compensation circuit for generating a temperature-compensation voltage and an AFC input circuit for receiving an AFC voltage from said automatic frequency control voltage input terminal; and said temperature-compensation voltage and a voltage generated in said AFC input circuit are applied to said voltage-variable capacitance element.

7. The temperature-compensated crystal oscillator according to claim 1, wherein the damping resistors are connected to the power supply terminal, the output terminal, and the, automatic frequency control voltage input terminal, respectively, outside the oscillation closed loop.

8. The temperature-compensated crystal oscillator according to claim 3, wherein all of (a), (b), and (c) are provided.

9. The temperature-compensated crystal oscillator according to claim 1, wherein the damping resistor is connected to the power supply terminal.

10. The temperature-compensated crystal oscillator according to claim 1, wherein the damping resistor is connected to the output terminal.

11. The temperature-compensated crystal oscillator according to claim 1, wherein the damping resistor is connected to the automatic frequency control voltage input terminal.

* * * * *